United States Patent
Lipp (10) Patent No.: US 7,020,216 B1
(45) Date of Patent: Mar. 28, 2006

(54) METHOD FOR ADJUSTING A PHASE ANGLE OF A PHASE MODIFIER OF A TRANSMITTING DEVICE

(75) Inventor: Friedrich Lipp, Hof bei Salzburg (AT)

(73) Assignee: Rohde & Schwarz GmbH & Co KG, Munich (DE)

( * ) Notice: Subject to any disclaimer, the term of this patent is extended or adjusted under 35 U.S.C. 154(b) by 769 days.

(21) Appl. No.: 10/070,795

(22) PCT Filed: Jun. 29, 2000

(86) PCT No.: PCT/EP00/06078

§ 371 (c)(1),
(2), (4) Date: Mar. 8, 2002

(87) PCT Pub. No.: WO01/24467

PCT Pub. Date: Apr. 5, 2001

(30) Foreign Application Priority Data

Sep. 29, 1999 (DE) ................................ 199 46 669

(51) Int. Cl.
*H04L 27/20* (2006.01)

(52) U.S. Cl. ...................... 375/308; 375/329; 375/279; 455/24; 455/69; 455/126; 330/260; 330/294

(58) Field of Classification Search ................ 375/308, 375/297, 219, 296, 279, 329; 330/2, 129, 330/294, 260; 455/126, 78, 69, 24

See application file for complete search history.

(56) References Cited

U.S. PATENT DOCUMENTS

| 5,381,108 A | * | 1/1995 | Whitmarsh et al. ............ 330/2 |
| 5,623,226 A | * | 4/1997 | Whitmarsh et al. ............ 330/2 |
| 5,793,817 A | | 8/1998 | Wilson |
| 5,894,496 A | * | 4/1999 | Jones ......................... 455/126 |
| 6,466,628 B1 | * | 10/2002 | Kim ........................... 375/297 |

FOREIGN PATENT DOCUMENTS

| EP | 0 706 259 A1 | 4/1996 |
| WO | WO 98/00908 A1 | 1/1998 |
| WO | WO 99/04486 A1 | 1/1999 |
| WO | WO 99/17439 A1 | 1/1999 |
| WO | WO 00/25421 A1 | 5/2000 |

* cited by examiner

*Primary Examiner*—Stephen Chin
*Assistant Examiner*—Ted Wang
(74) *Attorney, Agent, or Firm*—Caesar, Rivise, Bernstein, Cohen & Pokotilow, Ltd.

(57) ABSTRACT

A method for adjusting a phase angle (φ) of a phase modifier (25) of a transmitting device which includes a quadrature modulator (3), a power amplifier (9), a quadrature demodulator (19) and differential amplifiers (26, 27). The power amplifier (9) is linearized via the feedback loop (16) according to the Cartesian feedback method. The phase modifier (25) supplies an oscillator signal to the quadrature demodulator (19), which signal is shifted by the phase angle (φ) to be adjusted with regard to the oscillator signal that is supplied to the quadrature modulator (3). An input signal with a constant inphase component (I) and a constant quadrature phase component (Q) is applied during each transmission burst in the instance of a closed feedback loop, and the quadrature component (VQM) and/or the inphase component (VIM) is measured at a measuring point (53, 61) located behind the output of the differential amplifiers (26, 27).

20 Claims, 4 Drawing Sheets

METHOD FOR ADJUSTING A PHASE ANGLE OF A PHASE MODIFIER OF A TRANSMITTING DEVICE

This application is a 371 of PCT/EP00/06078, filed Jun. 29, 2000, which claims priority to Germany application No. 199 46 669.6, filed Sep. 29, 1999.

BACKGROUND OF THE INVENTION

The invention relates to a method for adjusting a phase angle of a phase modifier of a transmitting device. The transmitting device comprises a quadrature modulator and a power amplifier which is linearized via a so-called Cartesian feedback loop with a quadrature demodulator.

EP 0 706 259 A1 discloses a transmitting device wherein a basic band input signal is supplied to a quadrature modulator via two differential amplifiers. Said quadrature modulator performs quadrature modulation of the inphase component and the quadrature phase component of the complex input signal. Power amplification takes place in a power amplifier connected downstream the quadrature modulator. To compensate the non-linearity of this power amplifier a feedback loop is provided, generally designated as a Cartesian which separates the fedback signal into a fedback inphase component and a fedback quadrature phase component. The fedback inphase component is supplied, together with the inphase component of the input signal, to a first differential amplifier, connected upstream the quadrature modulator. Correspondingly, the fedback quadrature phase component is supplied, together with the quadrature phase component of the input signal, to a second differential amplifier. In this way the non-linearities of the power amplifier are compensated via the fedback signal.

In a transmitting device operating according to the Cartesian feedback method it is particularly important that the fedback signal is input inphase. In order to achieve this, the signal of a local oscillator, which is required for the quadrature modulation and quadrature demodulation, is supplied to the quadrature demodulator at a phase angle shifted with regard to the quadrature modulator. The phase shift takes place in a phase modifier, the phase angle of which has to be adjusted. To adjust the phase angle, in EP 0 706 259 A1 a test mode is proposed, in which the feedback loop is interrupted at the output of the quadrature demodulator. A test signal is applied to the input of the quadrature modulator and the output signal of the quadrature demodulator is measured. With a predetermined input signal the phase angle to be set can be calculated from the real part and the imaginary part of the output signal of the quadrature demodulator.

Of disadvantage in the mode of operation proposed in EP 0 706 259 A1, however, is that the feedback loop for determining the phase angle has to be opened each time. This method may be suitable for adjusting the phase angle once on taking into operation, but in the application of a transmitting device operating on the Cartesian feedback principle in aeronautical radio, in particular with digital aeronautical radio operating according to the VDL standard (VHL digital link) in TDMA Simplex mode, there is a necessity to check and possibly re-adjust the phase angle at each transmitting interval (transmitting burst). This cannot be done with the method emerging from EP 0 706 259 A1, owing to the time-consuming separation of the feedback loop and the complicated measurement process.

SUMMARY OF THE INVENTION

Therefore the object of the invention is to cite a method for adjusting a phase angle of a phase modifier of a transmitting device with a power amplifier which is linearized according to the Cartesian feedback principle, which enables correction or re-setting of the phase angle at each transmitting interval.

The object is achieved by the characterising features of claim 1 in conjunction with the generic features.

The invention is based on the awareness that, by applying an input signal with a predetermined constant inphase component and a predetermined constant quadrature phase component, a deviation of the phase angle can be relatively easily determined. The feedback loop, consisting of quadrature modulator, power amplifier and quadrature demodulator and the differential amplifiers, can therein remain closed. The method can be carried out at each transmitting interval, as it is not time-consuming and does not require separation of the feedback loop.

Claims 2 to 9 relate to advantageous further developments of the method according to the invention.

Applying an input signal with predetermined inphase component (I=const.) and without quadrature phase component (Q=0) and measuring the quadrature phase component can advantageously take place at the output of the differential amplifier at the beginning of every transmitting interval. During switching over from receive mode to transmit mode it is in any case advantageous to apply, in addition, for example, to three data symbols, a reference signal with a pure inphase component without quadrature phase component at the beginning of the transmitting interval. This reference signal can be used for determining the phase according to the invention without taking extra time. With an input signal without quadrature phase component (Q=0) ideally no voltage occurs at the output of the differential amplifier in the quadrature phase control loop. If a voltage is nevertheless measured at this measuring point this indicates a phase error, which can be corrected in the next transmitting interruption interval or receiving interval.

The phase correction value can be immediately determined from the measured quadrature phase component, optionally taking into account the additionally measured inphase component, by an arcus tangens relation. The phase correction values assigned to the measured values can be tabulated in a memory (look-up table) and read off immediately without further calculation. An alternative possibility for determining the optimum phase correction value consists in a trial and error method, in which the phase angle is minimally altered experimentally during a receiving interval and in the subsequent transmitting interval, by measuring the quadrature phase component with the previously described reference signal, it is ascertained whether the newly adjusted phase angle yields a better result. If this is the case, the phase angle is further altered in this direction in the subsequent receiving interval. If the newly set phase angle yields a worsening, in the subsequent receiving interval the phase angle is adjusted back to the previously set value. Due to this fine alignment, minimal phase fluctuations, resulting, for example, from a drift in temperature, can be re-corrected while operation is running.

Before the transmitting device is taken into operation for the first time it is advantageous to perform a preliminary adjustment of the phase angle in such a way that a minimal output power results. For this case the maximum self-damping of the system results, by contrast with the reverse case of maximum output power, resulting in maximum positive feedback of the system. The signal of the feedback loop is in this case damped.

A simplified embodiment example of the invention is described in greater detail below with reference to the drawings.

DETAILED DESCRIPTION OF THE INVENTION

Figure 1:
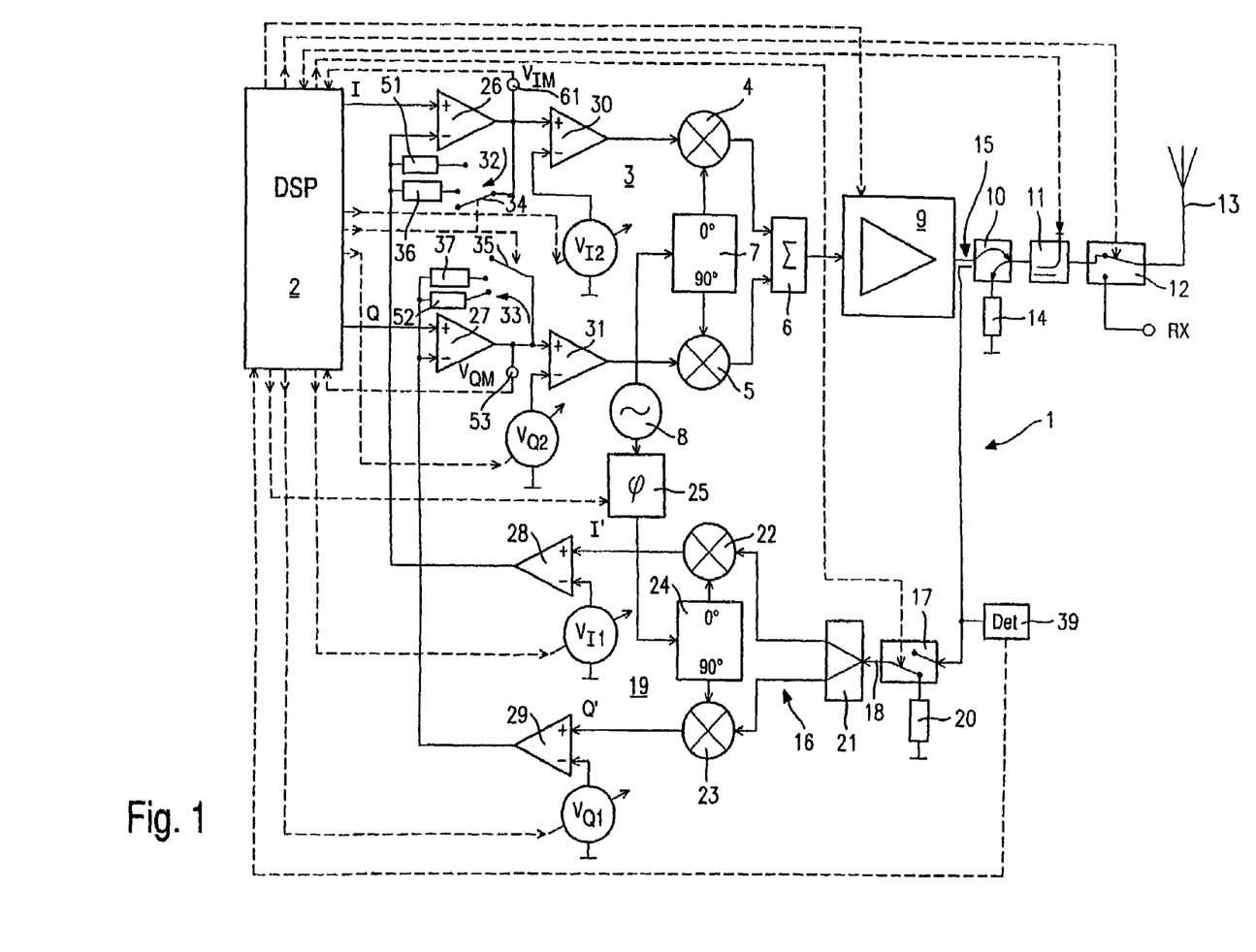
FIG. 1 shows a block diagram of an embodiment example of a transmitting device, suitable for the method according to the invention.

FIG. 1 shows a transmitting device 1 suitable for carrying out the method according to the invention in a basic block diagram.

A digital signal processor (DSP) 2 generates a complex input signal for a quadrature modulator 3, consisting of an inphase mixer 4, a quadrature phase mixer 5 and a summer 6, as well as a phase modifier 7. The complex input signal consists of an inphase component I and a quadrature phase component Q, wherein the inphase component I is supplied to the inphase mixer 4 and the quadrature phase component Q is supplied to the quadrature phase mixer 5. The output signal of a local oscillator 8 is supplied to the phase modifier 7, wherein the phase modifier 7 supplies this oscillator signal to the inphase mixer 4 without phase shift and to the quadrature phase mixer 5 at a phase shift of 90°.

Connected downstream the quadrature modulator 3 is a power amplifier 9 which supplies the quadrature-modulated signal, power-amplified corresponding to the transmitting power of the transmitting device 1, to an antenna 13 via a circulator 10, a power detector 11 and a transmit-receive changeover switch 12. In the embodiment example illustrated in FIG. 1 the digital signal processor 2 acts simultaneously as control unit for the transmit-receive changeover and triggers the transmit-receive changeover switch 12 in such a way that the antenna 13 is connected to the power amplifier 9 in transmit mode and to a receiver designated as an RX in receive mode. The circulator 10, connected to the terminal resistance 14, serves to avoid feedback of possibly reflected transmitting power into the power amplifier 9.

In the signal path between the power amplifier 9 and the antenna 13 is a decoupler 15, which couples the output signal of the power amplifier 9 into a feedback loop 16. In the feedback loop 16 is a changeover switch 17, via which an input 18 of a quadrature demodulator 19 can be optionally connected to the decoupler 15 or a terminal resistance 20. Between the decoupler 15 and the changeover switch 17 is a logarithmic power detector 39. The quadrature demodulator 19 consists of a signal divider 21, which divides the input signal equally between an inphase mixer 22 and a quadrature phase mixer 23. Further provided is a phase modifier 24, to which the output signal of the local oscillator 8 is supplied via an adjustable phase modifier 25. Phase modifier 24 operates like phase modifier 7 and supplies to the inphase mixer 22 a non-phase-shifted oscillator signal and to the quadrature phase mixer 23 an oscillator signal phase-shifted by 90°, wherein the oscillator signal has previously been phase-shifted in total by a phase angle $\phi$ by the phase modifier 25.

At the output of the inphase mixer 22 is a fedback inphase component I' and at the output of the quadrature phase mixer 23 is a fedback quadrature phase component Q'. The inphase component I of the input signal is passed to the (+) input of a first differential amplifier 26, while the fedback inphase component I' is passed to the (−) input of the first differential amplifier 26. Correspondingly the quadrature phase component Q of the input signal is supplied to the (+) input of a second differential amplifier 27, while the fedback quadrature phase component Q' is supplied to the (−) input of the second differential amplifier 27. By means of this feedback arrangement, generally designated as Cartesian feedback, it is achieved that linearization errors of the power amplifier 9 are compensated by the quadrature demodulator 19, arranged in the feedback loop 16, and the differential amplifiers 26 and 27. It should therein be ensured, however, that the fedback signal I', Q' is supplied to the differential amplifiers 26 and 27 with a phase shift of 0° with regard to the input signal I, Q. The correct phase position is set by the adjustable phase modifier 25, the phase angle $\phi$ of which can be altered with the method according to the invention by the digital signal processor via a control signal.

As both the quadrature modulator 3 and the quadrature demodulator 19 have a direct current offset (DC offset), this direct current offset has to be correspondingly compensated. A third differential amplifier 28, arranged between the inphase mixer 22 of the quadrature demodulator 19 and the first amplifier 26, serves this purpose. A fourth differential amplifier 29 is arranged between the quadrature phase mixer 23 of the quadrature demodulator 19 and the second differential amplifier 27. While the fedback inphase component I' is supplied to the (+) input of the third differential amplifier 28, a first compensation voltage $V_{I1}$ is supplied to the (−) input of the third differential amplifier 28, so the direct current offset in the I' component of the quadrature demodulator 19 is compensated at the output of the third differential amplifier 28. Correspondingly the fedback quadrature phase component Q' is supplied to the fourth differential amplifier 29 at its (+) input, while a fourth compensation voltage $V_{Q1}$ is supplied to its (−) input.

A fifth differential amplifier 30, to the (+) input of which the output of the first differential amplifier 26 is supplied, while a third compensation voltage $V_{I2}$ is supplied to its (−) input, serves to compensate the direct current offset of the quadrature modulator 3. Further provided is a sixth differential amplifier 31, the output of which is connected to the quadrature phase mixer 5 of the quadrature modulator 3 and to the (+) input of which the output of the second differential amplifier 27 is supplied. A fourth compensation voltage $V_{Q2}$ is supplied to the (−) input of the sixth differential amplifier 31. The compensation voltages $V_{I1}$, $V_{Q1}$, $V_{I2}$, and $V_{Q2}$ are drawn in as controllable voltage sources in FIG. 1 for better illustration, however these compensation voltages are expediently generated internally in the digital signal processor 2.

With fast changeover between transmit mode and receive mode there is a problem, where a feedback loop 16 according to the Cartesian feedback principle is used, that the high frequency signal path of the loop, consisting of the quadrature modulator 3, the power amplifier 9, the quadrature demodulator 19 and the differential amplifiers 26 and 27, has to be interrupted during the changeover from transmit mode to receive mode, as the power amplifier 9 and the local oscillator 8 have to be switched off. When the power amplifier 9 and the local oscillator 8 are switched on again and the high frequency signal path is restored via the feedback loop 16, a switching shock pulse is caused, as the voltages of the control system, in other words the output voltages of the two differential amplifiers 26, 27, run to the positive or negative control limit stop when the high frequency signal path is open. This leads to an unacceptable sudden power variation to the maximum possible transmitting power of the power amplifier 9. Therefore in FIG. 1, as well as the high frequency signal path from the output of the differential amplifiers 26 and 27 via the quadrature modulator 3, the power amplifier 9 and the quadrature demodulator 19 to the (−) input of the differential amplifiers 26 and 27, two direct DC signal paths 32 and 33 are to be provided which directly connect the output of the differential amplifier 26 or 27, assigned in each case, to the (−) input of the respective differential amplifier 26 or 27. The direct DC signal paths 32 and 33 consist in the embodiment example illustrated in each case of a controllable switch 34 or 35, which can be constructed, for example, as field-effect transistors, and a resistance 36 or 37, connected in series. During receive mode a constant 0V potential can be maintained at the input and output of the differential amplifier 26 and 27, so the changeover to transmit mode takes place without shock pulses. The function of the low impedance resistances 51 and 52, arranged parallel to the resistances 36 and 37 and able to be connected to the switches 34 and 35 via a separate switch position, is explained in more detail later.

Figure 2:
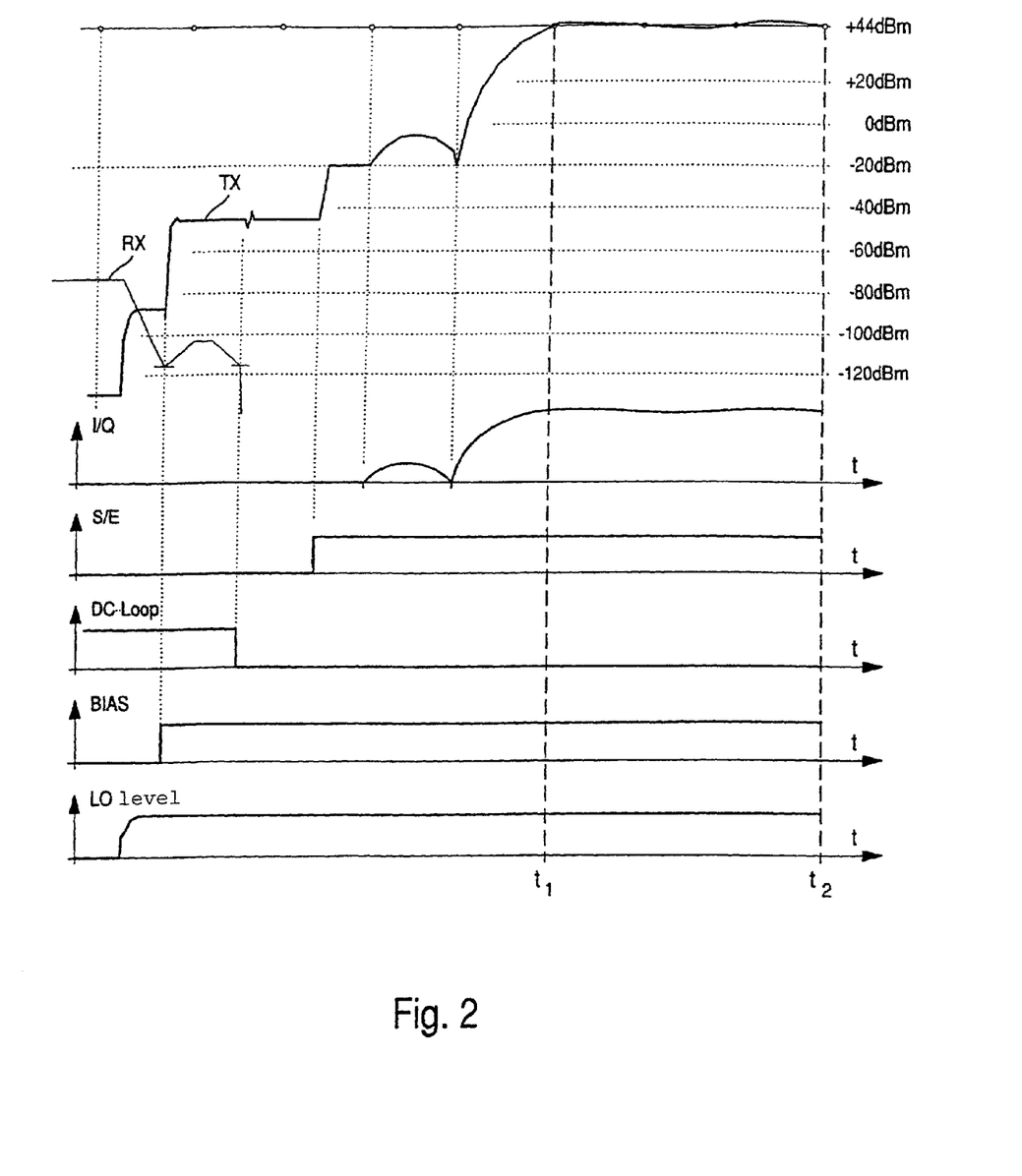
FIG. 2 shows a time-dependency diagram to explain the method according to the invention.

FIG. 2 shows in a time-dependency diagram the sequence of the changeover from receive mode to transmit mode. In the top partial diagram the output power TX is represented logarithmically as a function of the time. Further illustrated in FIG. 2 and designated as RX is the signal of the latest possible receiving interval. In the partial diagram below it the input signal I/Q is represented as a function of the time. Below this is the signal "S/E" for actuating the transmit/receive changeover switch 12 and the signal "DC loop" for actuating switches 34 and 35 in each case as a function of the time t. The signal "BIAS" designates the supply voltage for the power amplifier 9, while the signal "LO level" designates the level of the local oscillator 8.

As can be seen from FIG. 2, during the changeover from receive mode to transmit mode the procedure is as follows:

First the level of the local oscillator 8 is increased. Then the supply voltage (BIAS) for the power amplifier 9 is switched on and the switch 17 subsequently actuated, so the input of the quadrature demodulator 19 is switched over to the decoupler 15. After the high frequency feedback loop has thus been closed, switches 34 and 35 are opened by the signal "DC loop" and the direct current paths 32 and 33 are thus interrupted. Finally, by means of the signal "S/E" the transmit/receive changeover switch 12 is switched over to transmit mode. Subsequently the input signal I/Q can be supplied to the quadrature modulator 3 via the (+) inputs of the differential amplifiers 26 and 27 and the output power TX thus successively increased (ramping).

In the time interval between times $t_1$ and $t_2$ an almost constant output signal is available. In the embodiment example an input signal I/Q is used as reference signal between times $t_1$ and $t_2$, consisting of a constant inphase component (I=const.) without quadrature phase component (Q=0). This signal is applied as reference signal at the beginning of every transmitting interval before transfer of the actual data for a period of preferably three data symbols in the time interval between times $t_1$ and $t_2$. Simultaneously at least the quadrature phase component $V_{QM}$ is measured at measuring point 53 in FIG. 1. Preferably the inphase component $V_{IM}$ is also measured at measuring point 61. Since a pure inphase component without quadrature phase component is used as input signal, ideally, i.e. with correctly chosen phase angle ϕ for the phase modifier 25, the measuring signal $V_{QM}$ at measuring point 53 is zero. If a deviating measuring voltage occurs this indicates a phase error which is to be corrected.

Figure 3:
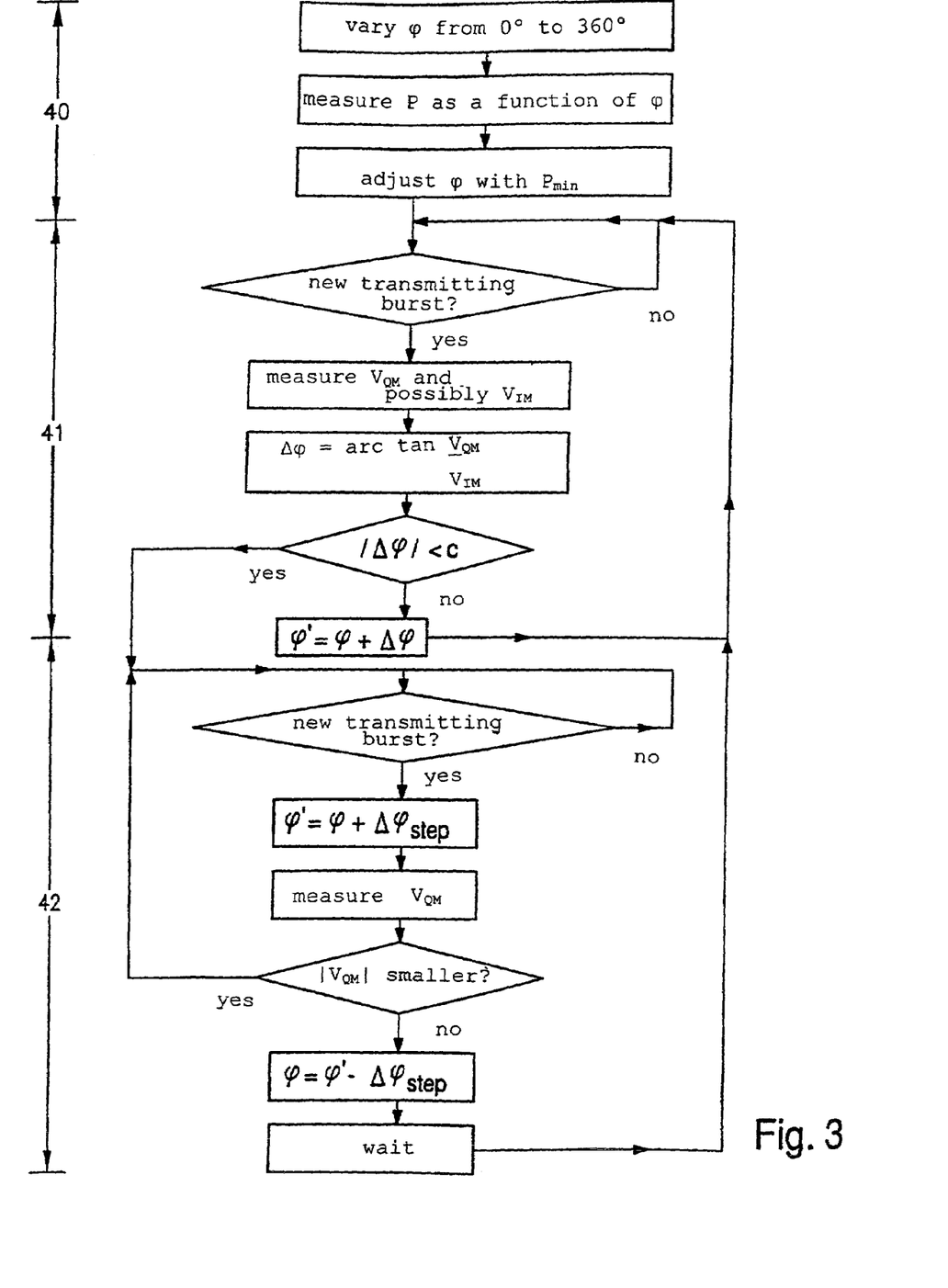
FIG. 3 shows a flow diagram to explain an embodiment example of the method according to the invention and FIG. 4 shows a diagram to explain the measuring of the phase correction angle.

The method according to the invention for adjusting the phase angle ϕ is explained using FIG. 3. The method is divided into pre-adjusting of the phase angle p, to be performed once when the transmitting device 1 is taken into operation (method steps 40), re-setting the phase angle ϕ at each transmitting interval (transmitting burst) (method steps 41) and optional fine re-setting of the phase angle ϕ at each transmitting interval (method steps 42).

When the transmitting device 1 is taken into operation the phase angle ϕ of the phase modifier 25 in the embodiment example illustrated in FIG. 3 is pre-adjusted in such a way that the power P is measured as a function of the phase angle ϕ by the logarithmic power detector 39 or by the power detector 11. The phase angle ϕ is therein continually varied in the range of 0° to 360°. Finally, the particular phase angle ϕ in which the measurement resulted in the minimum power $P_{min}$ is set. This measuring principle is based on the assumption that for the phase angle ϕ for which the minimum output power $P_{min}$ results the feedback loop 16 is optimally negatively fed back. The thus pre-adjusted phase angle ϕ usually offers a good starting point for the adjustment method to be described below, which is performed at each transmitting interval. During this measurement of the output power the signal of the feedback loop 16 is damped, in order to avoid too great a positive feedback with a rough misadjustment of the phase angle ϕ, with the danger of destroying the power amplifier 9. In the embodiment example this damping is achieved in that switches 34 and 35 are switched over to the low impedance resistances 51 and 52, in order to achieve strong negative feedback of the differential amplifiers 26 and 27.

Alternatively series resistances, for example, could also be connected in the feedback loop 16.

With the adjustment method according to the invention, as described, at the beginning of every transmitting interval or transmitting burst a reference signal with a pure inphase component (I=const.) without quadrature phase component (Q=0) is applied for a period of preferably three data symbols and at least the quadrature phase component (measuring signal $V_{QM}$) is measured at the output of the second differential amplifier 27 at measuring point 53. As the inphase component I is constant, it is sufficient to relate the measured quadrature phase component $V_{QM}$ to the input inphase component I and to use them as an argument for the arcus tangens function, in order to obtain the phase correction value Δϕ. Accuracy of measurement can be increased in that the measured quadrature phase component $V_{QM}$ is related not to the predetermined inphase component I at the input of the first differential amplifier 26, but to the inphase component $V_{IM}$ measured at the output of the first differential amplifier 26. The corrected phase angle ϕ' results from addition of the phase correction angle Δϕ to the previously adjusted phase angle ϕ. The phase correction value Δϕ can be read off in a stored table as a function of the measured signal $V_{QM}$ or $V_{QM}$ and $V_{IM}$.

In the variant of the adjustment method described in FIG. 3 re-setting the phase angle ϕ takes place by means of the arcus tangens function only until the obtained phase correction value Δϕ is greater than a predetermined constant c. If the phase correction value Δϕ is smaller than the limit value c, a change is made to an iterative fine adjustment method 42. This fine adjustment method 42 is based on a trial and error principle. Before each transmitting burst the currently set phase angle φ is altered experimentally by a step width $\Delta\phi_{step}$ and then at the beginning of the transmitting burst the measuring voltage $V_{QM}$ is measured at measuring point 53, while at the input a pure inphase component I without quadrature phase component applies. With a properly adjusted phase angle φ the measuring voltage $V_{QM}$ is ideally 0. If the amount $|V_{QM}|$ of the measuring voltage $V_{QM}$ is reduced by the variation of the adjusted phase angle φ, this newly adjusted phase angle φ' is better than the previously adjusted phase angle φ. The phase angle φ is optionally altered again in this direction for the next transmitting burst, in order to test whether the amount of the measuring voltage $V_{QM}$ therein decreases even further. The step width can optionally be varied as a function of the amount of the measuring voltage $V_{QM}$. If the amount of the measuring voltage $V_{QM}$ is greater, however, the setting is put back to the previously set phase angle φ.

This method is then repeated in the opposite direction with reversed algebraic sign of $\Delta\phi_{step}$. If fine adjustment in the opposite direction also does not result in an improvement, the previously set phase angle φ is the best value and is left for a predetermined period. After a period after which, for example, owing to a thermal drift, a shift in the phase angle φ may have resulted, the method described above is repeated.

Figure 4:
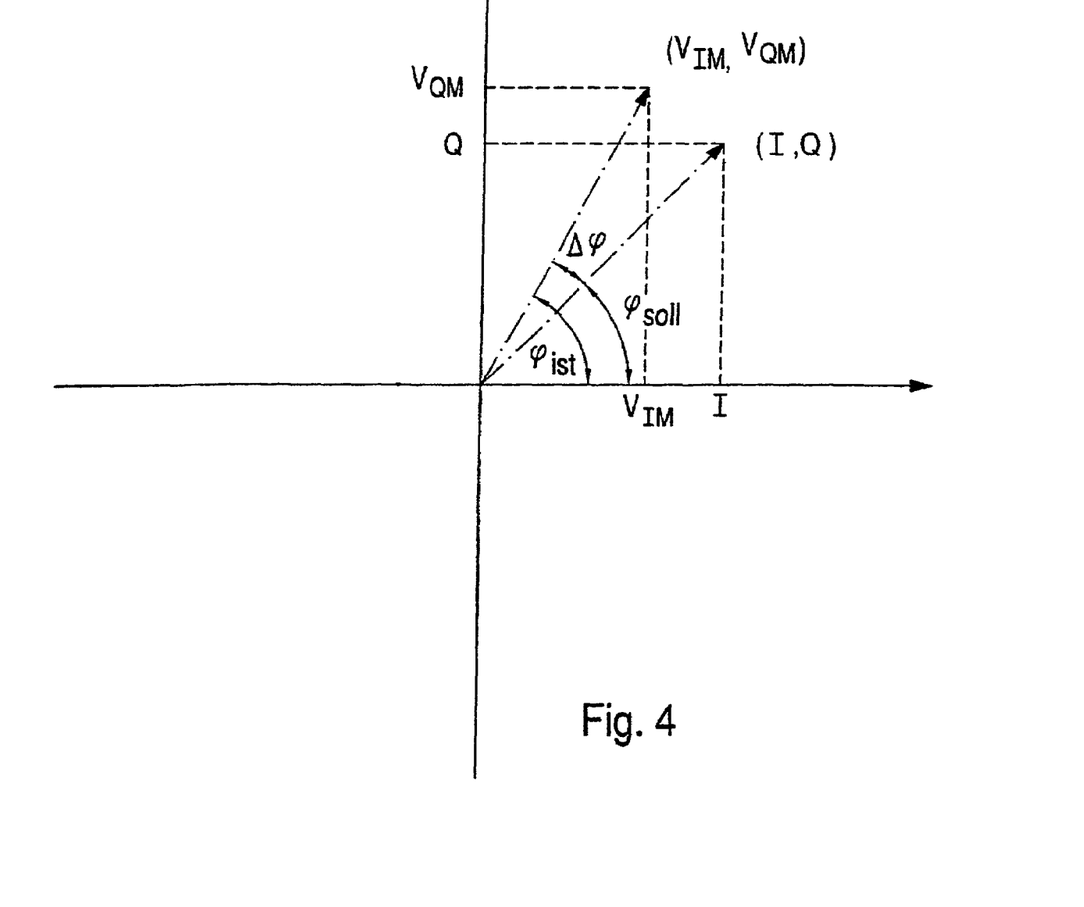

FIG. 4 shows the predetermined constant input signal (I, Q), consisting of the inphase component I and the quadrature phase component Q, and the measuring signal ($V_{IM}$, $V_{QM}$) measured at the output of the differential amplifiers 26 and 27, consisting of the measured inphase component VIM and the measured quadrature phase component $V_{QM}$.

The predetermined desired phase angle $\phi_{soll}$ results therein from the relation $$\varphi_{soll} = \arctan\frac{Q}{I}$$

The measured actual phase angle $\phi_{ist}$ results from the relation $$\varphi_{ist} = \arctan\frac{V_{QM}}{V_{IM}}.$$

The phase correction value Δφ results from the relation $$\Delta\varphi = \varphi_{ist} - \varphi_{soll} == \arctan-\frac{V_{QM}}{V_{IM}} - \arctan\frac{Q}{I}.$$

In the embodiment example described using FIG. 3 an input signal with a pure inphase component has been used, wherein the input quadrature phase component Q is zero, so $\phi_{soll}=0$. As the preceding relation shows, other input signals with other desired phase angles can also be used, however, wherein the use of the desired phase angle $\phi_{soll}=0$ is preferred owing to the resulting simplification of the measuring process.

The invention is not restricted to the embodiment example illustrated. In particular other algorithms than those illustrated in FIG. 3 can be used. The preliminary adjustment of the phase angle φ illustrated in FIG. 3 can also be done in other ways. Instead of an input signal with a pure inphase component any chosen input signal with constant phase angle φ can be used.

The invention claimed is:

1. A method for adjusting a phase angle of a phase modifier of a transmitting device, wherein said method comprises:
    providing the transmitting device comprising:
        a quadrature modulator for quadrature modulation of an inphase component and a quadrature phase component of a complex input signal;
        a power amplifier, connected downstream of the quadrature modulator;
        a quadrature demodulator for quadrature demodulation of an output signal of the power amplifier into a feedback inphase component and a feedback quadrature phase component;
    a first differential amplifier, connected upstream the quadrature modulator, said first differential amplifier having a first input supplied by the inphase component of the complex input signal and a second input supplied by the fedback inphase component;
    a second differential amplifier, connected upstream the quadrature modulator, said second differential amplifier having a first input of the second differential amplifier supplied by the quadrature phase component of the complex input signal and a second input of the second differential amplifier supplied by the fedback quadrature phase component; and
    a phase modifier, which supplies to the quadrature demodulator an oscillator signal, shifted with regard to an oscillator signal supplied to the quadrature modulator by the phase angle to be adjusted;
    applying an input signal with a predetermined constant inphase component and a predetermined constant quadrature phase component at each transmitting interval with a closed feedback loop containing the quadrature modulator, the power amplifier, the quadrature demodulator, the first differential amplifier and the second differential amplifier;
    measuring the quadrature phase component and optionally the inphase component at a first measuring point behind an output of the first differential amplifier and a second measuring point behind an output of the second differential amplifier;
    determining a phase correction value based on the measured quadrature phase component and optionally the measured inphase component; and
    correcting the currently set phase angle of the phase modifier by adding or subtracting the determined phase correction value in a transmitting interruption interval, wherein the phase angle is not altered if the amount of the measured quadrature phase component is smaller than a predetermined limit value.

2. The method according to claim 1, wherein the quadrature phase component of the complex input signal being applied has a value of zero, and the measuring at the second measuring point behind the output of the second differential amplifier takes place at a beginning of every transmitting interval.

3. The method according to claim 1, wherein the phase correction value (Δφ) is determined by solving the following equation:

$\Delta\phi = \arctan(V_{QM}/V_{IM}) - \arctan(Q/I)$ wherein $V_{QM}$ is the measured quadrature phase component, $V_{IM}$ is the measured inphase component, Q is the predetermined quadrature phase component and I is the predetermined inphase component.

4. The method according to claim 3, wherein prior to or concurrent with activating the transmitting device, the phase angle of the phase modifier is preliminarily adjusted such that an output power is measured at a power detector connected downstream of the power amplifier and the phase angle is pre-adjusted such that a minimum of the output power results.

5. The method according to claim 1, wherein the determining of the phase correction value comprises altering the phase angle by a step width in a first direction if the measured quadrature phase component is positive and altering the phase angle by a step width in an opposite direction if the measured quadrature phase component is negative.

6. The method according to claim 5, wherein the step width depends on an amount of the measured quadrature component.

7. The method according to claim 1, wherein prior to or concurrent with activating the transmitting device, the phase angle of the phase modifier is preliminarily adjusted such that an output power is measured at a power detector connected downstream of the power amplifier and the phase angle is pre-adjusted such that a minimum of the output power results.

8. A method for adjusting a phase angle of a phase modifier of a transmitting device, wherein said method comprises:
providing the transmitting device comprising:
a quadrature modulator for quadrature modulation of an inphase component and a quadrature phase component of a complex input signal;
a power amplifier, connected downstream of the quadrature modulator;
a quadrature demodulator for quadrature demodulation of an output signal of the power amplifier into a fedback inphase component and a fedback quadrature phase component;
a first differential amplifier, connected upstream the quadrature modulator, said first differential amplifier having a first input supplied by the inphase component of the complex input signal and a second input supplied by the fedback inphase component;
a second differential amplifier, connected upstream the quadrature modulator, said second differential amplifier having a first input of the second differential amplifier supplied by the quadrature phase component of the complex input signal and a second input of the second differential amplifier supplied by the fedback quadrature phase component; and
a phase modifier, which supplies to the quadrature demodulator an oscillator sigal, shifted with regard to an oscillator signal supplied to the quadrature modulator by the phase angle to be adjusted;
applying an input signal with a predetermined constant inphase component and a predetermined constant quadrature phase component at each transmitting interval with a closed feedback loop containing the quadrature modulator, the power amplifier, the quadrature demodulator, the first differential amplifier and the second differential amplifier;
measuring the quadrature phase component and optionally the inphase component at a first measuring point behind an output of the first differential amplifier and a second measuring point behind an output of the second differential amplifier;
determining a phase correction value based on the measured quadrature phase component and optionally the measured inphase component; and
correcting the currently set phase angle of the phase modifier by adding or subtracting the determined phase correction value in a transmitting interruption interval,
wherein the quadrature phase component of the complex input signal being applied has a value of zero, the measuring at the second measuring point behind the output of the second differential amplifier takes place at a beginning of every transmitting interval and the determining of the phase correction value comprises altering the phase angle by a step width in a first direction if the measured quadrature phase component is positive and altering the phase angle by a step width in an opposite direction if the measured quadrature phase component is negative.

9. The method according to claim 8, wherein the inphase component is measured at the first measuring point behind the output of the first differential amplifier.

10. The method according to claim 9, wherein the phase correction value ($\Delta\phi$) is determined by solving the following equation:

$$\Delta\phi = \arctan(V_{QM}/V_{IM}) - \arctan(Q/I)$$

wherein $V_{QM}$ is the measured quadrature phase component, $V_{IM}$ is the measured inphase component, Q is the predetermined quadrature phase component and I is the predetermined inphase component.

11. The method according to claim 8, wherein the phase correction value ($\Delta\phi$) is determined by solving the following equation:

$$\Delta\phi = \arctan(V_{QM}/V_{IM}) - \arctan(Q/I)$$

wherein $V_{QM}$ is the measured quadrature phase component, $V_{IM}$ is the measured inphase component, Q is the predetermined quadrature phase component and I is the predetermined inphase component.

12. The method according to claim 8, wherein the step width depends on an amount of the measured quadrature component.

13. The method according to claim 8, wherein the phase angle is not altered if the amount of the measured quadrature phase component is smaller than a predetermined limit value.

14. The method according to claim 8, wherein prior to or concurrent with activating the transmitting device, the phase angle of the phase modifier is preliminarily adjusted such that an output power is measured at a power detector connected downstream of the power amplifier and the phase angle is pre-adjusted such that a minimum of the output power results.

15. A method for adjusting a phase angle of a phase modifier of a transmitting device, wherein said method comprises:
providing the transmitting device comprising:
a quadrature modulator for quadrature modulation of an inphase component and a quadrature phase component of a complex input signal;
a power amplifier, connected downstream of the quadrature modulator;

a quadrature demodulator for quadrature demodulation of an output signal of the power amplifier into a fedback inphase component and a fedback quadrature phase component;

a first differential amplifier, connected upstream the quadrature modulator, said first differential amplifier having a first input supplied by the inphase component of the complex input signal and a second input supplied by the fedback inphase component;

a second differential amplifier, connected upstream the quadrature modulator, said second differential amplifier having a first input of the second differential amplifier supplied by the quadrature phase component of the complex input signal and a second input of the second differential amplifier supplied by the fedback quadrature phase component; and a phase modifier, which supplies to the quadrature demodulator an oscillator signal, shifted with regard to an oscillator signal supplied to the quadrature modulator by the phase angle to be adjusted;

applying an input signal with a predetermined constant inphase component and a predetermined constant quadrature phase component at each transmitting interval with a closed feedback loop containing the quadrature modulator, the power amplifier, the quadrature demodulator, the first differential amplifier and the second differential amplifier;

measuring the quadrature phase component and optionally the inphase component at a first measuring point behind an output of the first differential amplifier and a second measuring point behind an output of the second differential amplifier;

determining a phase correction value based on the measured quadrature phase component and optionally the measured inphase component; and correcting the currently set phase angle of the phase modifier by adding or subtracting the determined phase correction value in a transmitting interruption interval, wherein prior to or concurrent with activating the transmitting device, the phase angle of the phase modifier is preliminarily adjusted such that an output power is measured at a power detector connected downstream of the power amplifier and the phase angle is pre-adjusted such that a minimum of the output power results.

16. The method according to claim 15, wherein the phase angle is not altered if the amount of the measured quadrature phase component is smaller than a predetermined limit value.

17. The method according to claim 15, wherein the signal of the feedback loop is damped during measurement of the output power.

18. The method according to claim 15, wherein the inphase component is measured at the first measuring point behind the output of the first differential amplifier.

19. The method according to claim 18, wherein the phase angle is not altered if the amount of the measured quadrature phase component is smaller than a predetermined limit value.

20. The method according to claim 15, wherein the determining of the phase correction value comprises altering the phrase angle by a step width in a first direction if the measured quadrature phase component is positive and altering the phase angle by a step width in an opposite direction if the measured quadrature inphase component is negative.

\* \* \* \* \*